United States Patent
Chang et al.

(10) Patent No.: US 8,803,276 B2
(45) Date of Patent: Aug. 12, 2014

(54) ELECTROSTATIC DISCHARGE (ESD) DEVICE AND METHOD OF FABRICATING

(71) Applicant: International Business Machines Corporation, Armonk, NY (US)

(72) Inventors: Shunhua Chang, South Burlington, VT (US); Kiran V. Chatty, Williston, VT (US); Robert J. Gauthier, Hinesburg, VT (US); Mujahid Muhammad, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/073,119

(22) Filed: Nov. 6, 2013

(65) Prior Publication Data

US 2014/0061803 A1 Mar. 6, 2014

Related U.S. Application Data

(62) Division of application No. 12/048,461, filed on Mar. 14, 2008, now Pat. No. 8,597,993.

(51) Int. Cl.
*H01L 23/58* (2006.01)

(52) U.S. Cl.
USPC ............. 257/487; 257/69; 257/204; 257/577; 257/E21.352; 257/E21.379; 257/E21.381; 257/E21.382; 257/E21.4; 257/E21.421; 257/E21.632

(58) Field of Classification Search
USPC ............. 257/487, 68, 69, 204, 288, 350, 577, 257/E21.4, E21.421, E21.352, E21.379, 257/E21.381, E21.382, E21.632
See application file for complete search history.

(56) References Cited

U.S. PATENT DOCUMENTS

| | | | |
|---|---|---|---|
| 5,493,133 A | 2/1996 | Duvvury et al. | |
| 5,744,842 A | 4/1998 | Ker | |
| 5,949,634 A | 9/1999 | Yu | |
| 5,954,714 A | 9/1999 | Saadat et al. | |
| 5,982,217 A | 11/1999 | Chen et al. | |
| 6,465,768 B1 | 10/2002 | Ker et al. | |
| 6,628,493 B1 | 9/2003 | Chen et al. | |
| 6,844,595 B2 | 1/2005 | Chen | |
| 8,597,993 B2 * | 12/2013 | Chang et al. ................ | 438/199 |
| 2004/0027744 A1 | 2/2004 | Liu et al. | |
| 2004/0240128 A1 | 12/2004 | Boselli et al. | |
| 2006/0170054 A1 | 8/2006 | Mergens et al. | |
| 2007/0034896 A1 | 2/2007 | Song et al. | |

* cited by examiner

*Primary Examiner* — David Nhu

(74) *Attorney, Agent, or Firm* — Michael Le Strange; Roberts Mlotkowski Safran & Cole, P.C.

(57) ABSTRACT

A structure and method of fabricating electrostatic discharge (EDS) circuitry in an integrated circuit chip by integrating a lateral bipolar, either a p-n-p with a NMOSFET or a n-p-n with a PMOSFET within a triple well. The lateral bipolar preferably includes diodes at the I/O and/or the VDDs of the circuitry.

13 Claims, 4 Drawing Sheets

ELECTROSTATIC DISCHARGE (ESD) DEVICE AND METHOD OF FABRICATING

FIELD OF THE INVENTION

The present invention relates to the fabrication and structure of integrated circuit and, more particularly, to the fabrication and structure of the integrated circuit with an electrostatic discharge (ESD) device.

BACKGROUND OF THE INVENTION

To safeguard circuits in an integrated circuit chip from electrostatic discharge, a device is included in the integrated circuit chip for protection during an electrostatic discharge event. Such protection can prevent damage from high voltage or current transients. Metal oxide semiconductors field effect transistors (MOSFETs) are particularly vulnerable to electrostatic discharge because an electrostatic discharge event can damage the gates of the MOSFETs, especially those with thin gate oxides.

The trend in semiconductor manufacture continues to be the reduction of the size of the overall I/O area on an integrated circuit and to enable a larger number of I/O pins on an integrated circuit chip. Unfortunately, the largest percent of the I/O area is used by the electrostatic protection devices. Accordingly, to increase the number of I/Os on the overall integrated circuit, the size of the ESD protection devices and, hence, the I/O area of the ESD devices must be reduced without affecting the protection of the non-ESD devices.

ESD NMOSFETs are commonly used as ESD protection devices. The required characteristics of the NMOSFET based protection devices are: low trigger voltage (Vt1), high failure current (It2) and low on-resistance (Ron). In order to reduce the size of the ESD protection device and still meet the ESD protection requirements, the failure current of the ESD NMOSFET needs to be increased and the on-resistance needs to be decreased compared with prior art devices. This, in turn, would enable a reduction in the device width and, therefore, a reduction in the area of the ESD device. Substrate triggering techniques are commonly used to reduce the trigger voltage, increase the failure current and lower the on-resistance.

A basic prior art device for electrostatic discharge (ESD) protection is shown in FIG. 1 and is a n-channel MOSFET between the input pad and the substrate and closely coupled to ground. To enhance the protection capability of this prior art device, a further prior art technique employs a lateral NPN transistor integral within a n-channel MOSFET. This ESD device is used to shunt to ground a large transient by turning on the lateral NPN when the event occurs. Another prior art technique also uses a lateral NPN transistor but it is coupled to the input element and operates to activate when the input element voltage exceeds threshold, the threshold being greater than or equal to the ordinary operating voltage of the circuitry coupled to the input element. However, none of these prior art structures will provide sufficient ESD protection when the area of the protection device is reduced in size, such as by as much as about 20 percent.

SUMMARY OF THE INVENTION

Accordingly, the primary object of the present invention is to provide and fabricate a MOSFET integrated circuit with an ESD protection device of reduced area but with increased I/O pins and at least equal in protection ability to ESD devices of a larger scale.

A further object of the present invention is to provide and fabricate an ESD MOSFET with the required characteristic of a lower trigger voltage (Vt1) with a modified substrate triggering techniques to achieve this characteristic.

An additional object of the present invention is to provide and fabricate an ESD MOSFET with the required characteristic of a higher failure current (It2) with a modified substrate triggering techniques to achieve this characteristic.

Another object of the present invention is to provide and fabricate an ESD MOSFET with the required characteristic of a low on-resistance (Ron) with modified substrate triggering techniques to achieve this characteristic.

These and other objects and features of the present invention are accomplished by a method of fabricating, and the resulting structure, a protection device comprising integrating a lateral bipolar with a MOSFET and within a triple well including an isolated well for performing the substrate triggering. The MOSFET can be either a n-channel or a p-channel with the lateral bipolar being of opposite polarity. Preferably, the lateral bipolar is formed with diodes at its I/O and/or its VDDs.

BRIEF DESCRIPTION OF THE DRAWINGS

These and further features of the present invention will be apparent with reference to the following description of the present invention along with the following FIGS. 1-8.

DETAILED DESCRIPTION OF THE INVENTION

Figure 1:
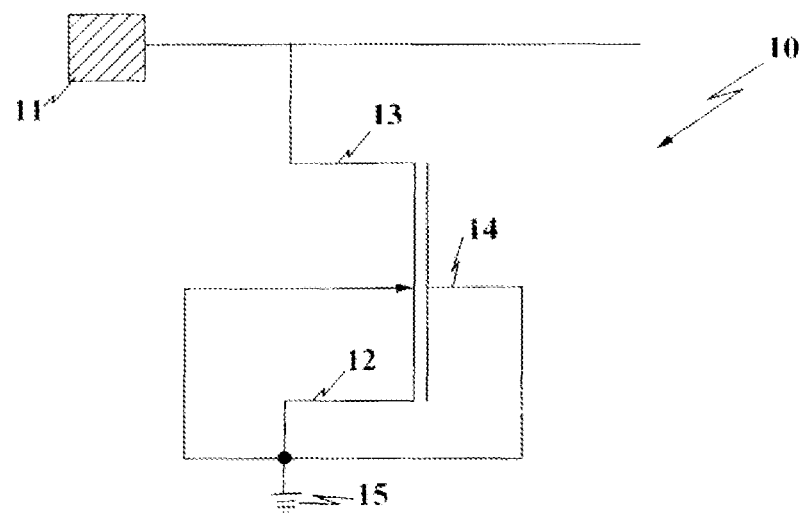
FIG. 1 (PRIOR ART) is a circuit schematic of a conventional ESD NMOSFET with a grounded gate.

As shown by the schematic of FIG. 1 (PRIOR ART), a NMOSFET 10 is connected to an I/O pad 11 and comprises a source 12, drain 13 and gate 14. In operation, during a positive mode discharge on the I/O pad 11 with respect to ground 15, the N+ drain 13/P-well junction breaks down and results in an avalanche of carriers in the form of generated holes. The holes are collected by the substrate and raise the substrate potential, which results in substrate current and in forward biasing the N+ source/P-well junction. A parasitic lateral n-p-n turns on and safely discharges the ESD current to ground 15.

Figure 2:
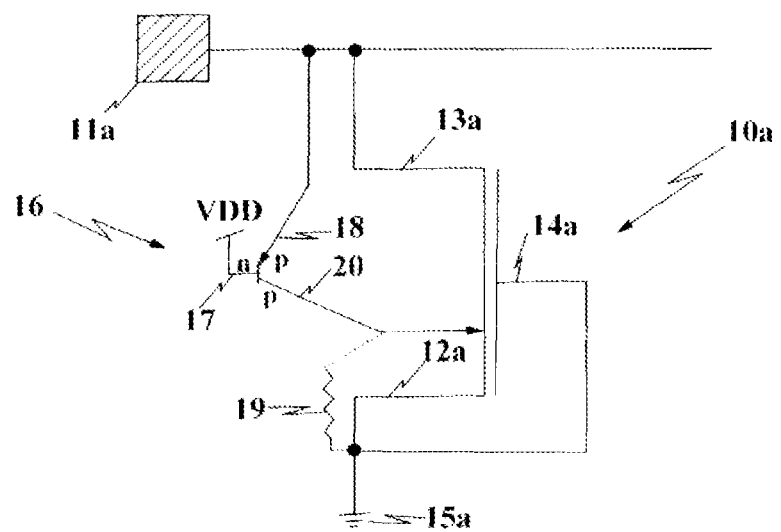
FIG. 2 is a circuit schematic of the preferred embodiment of the present invention with a lateral p-n-p integrated into an ESD NMOSFET and with the emitter of the p-n-p tied to the I/O pad.

In accordance with the present invention, the conventional MOSFET, herein a NMOSFET 10a in the preferred embodiment, is modified to provide an improved ESD protection device. A lateral bipolar, herein a p-n-p device 16, is fabricated and made integral with the NMOSFET 10a, as shown by the schematic of FIG. 2, and comprises an emitter 18, a collector 20, and a base 17. The emitter 18 of the lateral p-n-p 16 is connected to the I/O pad 11a and the base 20 of the p-n-p 16 is connected to VDD. The collector 18 of the p-n-p is connected to the isolated P-well. The resistance of the isolated P-well, which is connected to ground, is represented by the resistor 19. During an ESD event, the lateral p-n-p 16 injects holes into the isolated P-well, raising the isolated P-well potential. Thus, the P-well current (I-sub) which, is necessary to turn-on the parasitic lateral n-p-n, comes from two sources: 1) avalanche generation near N+ drain 13a/p-well junction, and 2) lateral p-n-p collector 20 current. For the ESD structure of the present invention, smaller drain voltage is required to turn-on the parasitic lateral n-p-n. Therefore, the ESD NMOSFET trigger voltage (Vt1) and holding voltage are reduced. By this reduction, the scale or area of the ESD protection device can be made smaller. In addition, there is an increase in the failure current and a reduction in the on-resistance of the ESD device. This reduction in trigger voltage (Vt1), the increase in failure current and the reduction in on-resistance permit the scaling down of the width and area of the ESD protection device and allow for an increased number of I/O pins in the ESD protection device and the functional circuits without reducing the protection capability of the ESD device.

Figure 3:
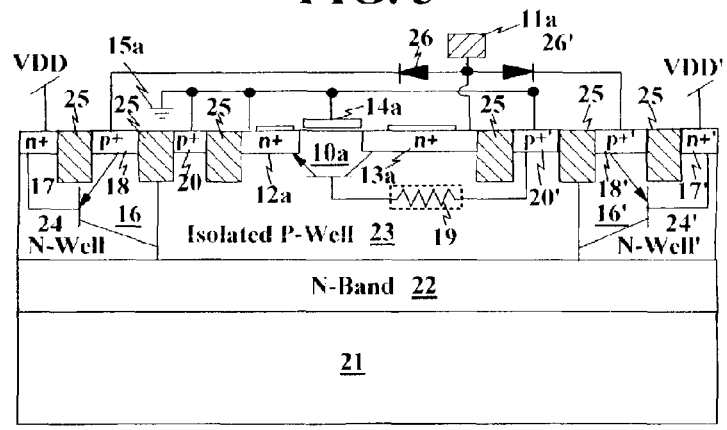
FIG. 3 is a cross-sectional view of the preferred embodiment of the present invention with an isolated P-well as part of a NMOSFET.

Turning now to FIG. 3, which is a cross-section of the ESD protection device of the present invention, there is shown a substrate 21 with an uniform N-band 22 therein. Above the N-band, a herein isolated P-Well 23, contains the herein NMOSFET 10a and is formed with a source 12a, a drain 13a and a gate 14a. In the present instance, on both sides of the isolated P-Well are N-Wells 24 and 24', which are physically the same Well. Deposed therein and integral with the NMOSFET 10a, are lateral bipolars, herein p-n-p 16 and 16' to achieve an apparent triple Well structure. N-Well 24 with lateral p-n-p 16 comprises the elements of a base 17, a emitter 18 and a collector 20 with a collector contact, while N-Well 24' with lateral p-n-p 16' comprises the elements of a base 17', a emitter 18' and a collector 20' with a collector contact. The contacts of the collectors 20 and 20' also serve as the isolated P-Well contact to the NMOSFET. These elements of the lateral n-p-n 16 and 16' are separated and isolated from each other and the MOSFET 10a in the substrate by the N-Band 22 and recessed trenches 25 containing an insulating material, such as silicon oxide. The emitters 18 and 18' of the lateral p-n-p 16 and 16' are connected to the I/O pad 11a, each preferably through diodes 26 and 26', and along with the drain 13a of the MOSFET, which herein has low leakage. Ground 15a is connected to the collector 20 and 20' of the lateral p-n-p and the source 12a and gate 14a of the MOSFET, whereas VDD is connected to the bases 17 and 17'. During normal operation of the integrated circuit, the bases 17 and 17' are connected to VDD causing the emitter-base diodes 26 and 26' to be preferably reversed biased. Although the diodes are not required, their purpose is to establish the voltage on the pad 11a higher than the VDD voltage and adjust current injected by p-n-p bipolar transistor.

Figure 4:
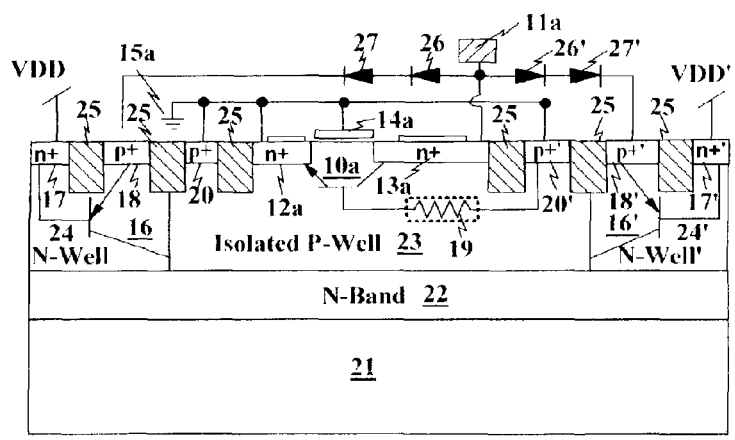
FIG. 4 is a cross-sectional view of a modification of the preferred embodiment of the present invention with additional diodes in series with the emitter-base diodes of the lateral p-n-p.

A modification of the preferred embodiment of the present invention is shown in FIG. 4 where additional emitter-base diodes 27 and 27' are disposed in series with the emitter-base diodes 26 and 26'. Although only two diodes are added in series in FIG. 4, more diodes could be added in series if desired.

Figure 5:
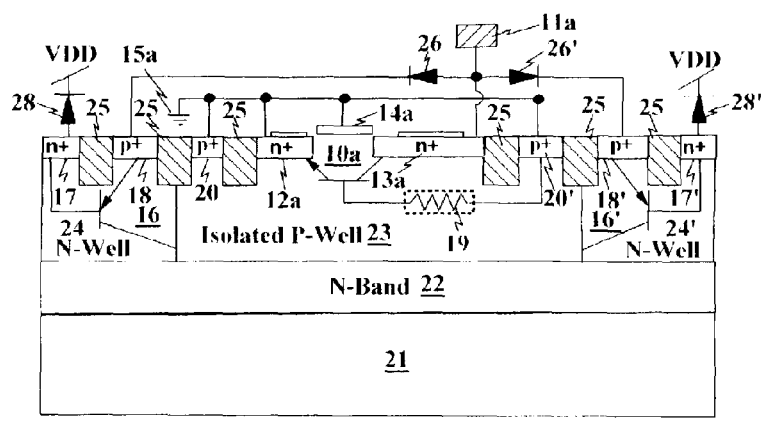
FIG. 5 is a cross-sectional view of a further modification of the preferred embodiment of the present invention with diodes at each of the VDDs.

A further modification of the preferred embodiment of the present invention is shown in FIG. 5 where diodes 28 and 28' are added to the collectors 17 and 17', respectively, at VDD. These diodes can be partially or totally in place of or in addition to the diodes 26, 26' 27 and 27' of FIG. 4.

In operation, during a positive mode ESD event on the I/O pad 11a, the n+ drain 13a/isolated P-Well 23 junction breaks down and results in an avalanche generation of carriers. The generated holes are collected in the isolated P-Well and this raises the overall isolated P-Well potential. The resulting isolated P-Well current causes a local isolated P-Well potential increase and in forward biasing the n+ source 12a/isolated P-Well 23. With these conditions, the parasitic lateral n-p-n turns on and safely discharges ESD current to ground 15a. Thus, unique to the present invention, the isolated P-Well current (Isub) necessary to turn-on the parasitic lateral n-p-n is provided by two sources; namely, 1) avalanche generation near n+ drain 13a/P-Well junction 23, and 2) lateral p-n-p collector 20 and 20' current. Accordingly, for the same MOSFET structure as the prior art, a smaller drain 13a voltage is now required to turn on the parasitic lateral n-p-n. Because of this, the ESD MOSFET trigger voltage (Vt1) and holding voltage can be reduced which, in turn, permits a smaller dimension integrated circuit with increased I/O pins with similar ESD protection as the prior art of a larger dimension integrated circuit with fewer I/O pins. A large failure current is achieved with this reduced ESD device area. The trigger voltage (Vt1) is smaller than the Vt1 of any NFET and/or PFET drivers and the gate oxide breakdown voltage of any receivers.

During a negative mode ESD event on the I/O pad 11a, the N+/isolated P-Well diode which is intrinsic to an NMOSFET turns on and discharges the ESD current safely to ground. The N+/isolated P-Well 23 comprises the cathode formed in the drain 13a junction and the anode contact which is formed by the isolated P-Well 23.

Figure 6:
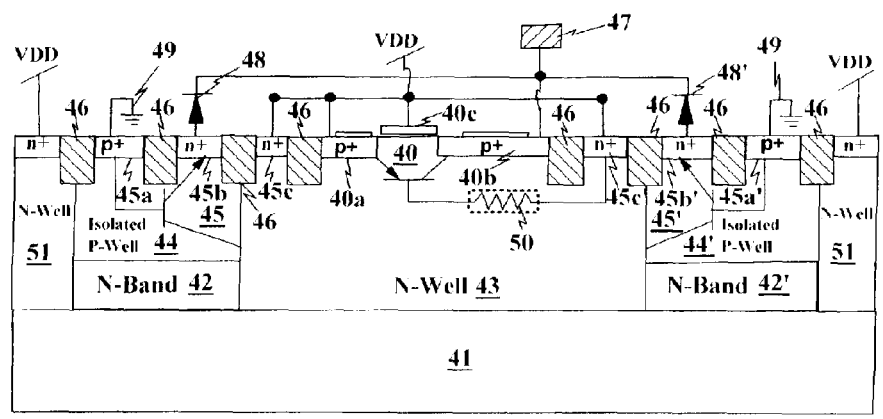
FIG. 6 is a cross-sectional view of an alternative embodiment of the present invention with an isolated N-well as part of a PMOSFET.
Figure 7:
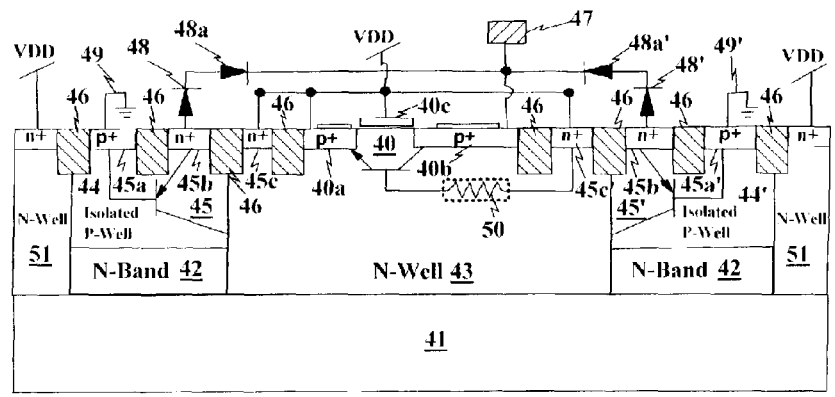
FIG. 7 is a cross-sectional view of a modification of the alternative embodiment of the present invention with additional diodes in series with the emitter-base diodes of the lateral n-p-n.
Figure 8:
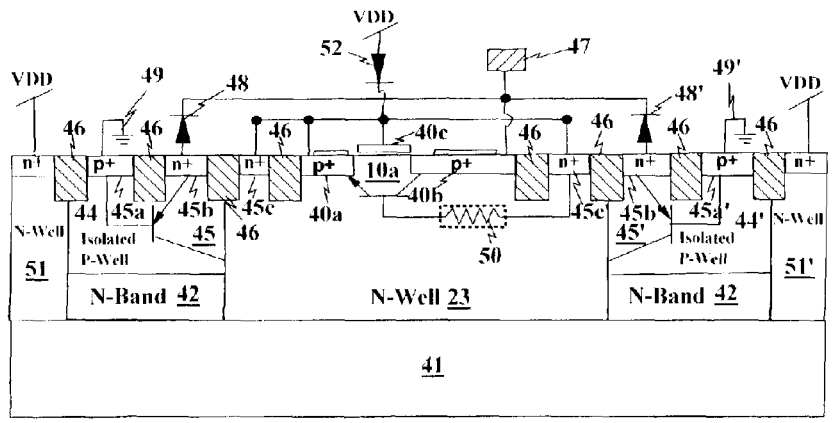
FIG. 8 is a cross-sectional view of a further modification of the alternative embodiment of the present invention with a diode at the VDD.

In accordance with another aspect of the present invention, an alternative embodiment is disclosed and shown in FIGS. 6-8. In FIG. 6, which is a cross-section of the alternative ESD protection device of the present invention, there is shown a substrate 41 with N-bands 42 therein and separated by a N-Well 43, which contains herein PMOSFET 40 and is formed with a source 40a, a drain 40b and a gate 40c which is connected to VDD, preferably through a diode 52. Above the N-bands 42, which are connected and are a single band, are formed isolated P-Wells 44, which again are connected and are physically the same well. Deposed therein and integral with the PMOSFET 40, are lateral bipolars, herein n-p-n 45 and 45' to achieve an apparent triple Well structure. Isolated P-Well 44 with lateral n-p-n 45 comprise the elements of a base 45a, an emitter 45b and a collector 45c with a collector contact (not shown), while isolated P-Well 44' with lateral n-p-n 45' comprises the elements of a base 45a', an emitter 45b' and a collector 45c' with a collector contact. The contacts of the collectors 45c and 45' also serve as the isolated N-Well contact to the PMOSFET 40. These elements of the lateral n-p-n 44 and 44' are separated and isolated from each other and the PMOSFET 40 in the substrate by the N-Band 42 and recessed trenches 46 containing an insulating material, such as silicon oxide. The emitters 45b and 45b' of the lateral p-n-p 45 and 45' are connected to the I/O pad 47, each preferably through diodes 48 and 48', and along with the drain 40b of the PMOSFET, which herein has low leakage. Ground 49 is connected to the base 45a and 45a' of the lateral p-n-p and to the PMOSFET, whereas VDD is connected to the emitters 45*b* and 45*b*'. The resistance of the isolated P-well, which is connected to ground, is represented by the resistor 50. Adjacent the outer sides of the P-Wells 44 and 44', N-Wells 51 and 51' are formed and connected to VDD to isolate the P-Wells 44 and 44' in the substrate 41, along with the N-Bands 42 and 42' and the N-Well 43. During normal operation of the integrated circuit, the bases 45*a* and 45*a*' are connected to ground causing the emitter-base diodes 48 and 48' to be preferably reversed biased. Although the diodes are not required, their purpose is to establish the voltage on the pad 47 lower than the ground voltage and/or to adjust current injected by n-p-n bipolar transistors.

In operation, during a negative mode ESD event on the I/O pad 47, the p+ drain 40*c*/N-Well 43 junction breaks down and results in an avalanche generation of carriers. The generated electrons are collected in the N-Well and this raises the overall N-Well potential. The resulting N-Well current causes a local N-Well potential to decrease and results in forward biasing the n+ source 40*a*/isolated N-Well 43. With these conditions, the parasitic lateral p-n-p turns on and safely discharges ESD current to VDD. Thus, unique to the present invention, the N-Well current (Isub) necessary to turn-on the parasitic lateral p-n-p is provided by two sources; namely, 1) avalanche generation near p+ drain 40*b*/N-Well junction 43, and 2) lateral n-p-n collector 45 and 45' current. Accordingly, for a MOSFET structure as the prior art, a smaller drain 40*b* voltage is now required to turn on the parasitic lateral p-n-p. Because of this, the ESD MOSFET trigger voltage (Vt1) and holding voltage can be reduced which, in turn, permits a smaller dimension integrated circuit with increased I/O pins with similar ESD protection as the prior art of a larger dimension integrated circuit with fewer I/O pins. A large failure current is achieved with this reduced ESD device area. The trigger voltage (Vt1) is smaller than the Vt1 of any NFET and/or PFET drivers and the gate oxide breakdown voltage of any receivers.

During a positive mode ESD event on the I/O pad 47, the P+/N-Well diode which is intrinsic to an PMOSFET turns on and discharges the ESD current safely to VDD. The P+/isolated N-Well 43 comprise the anode formed in the drain 40*b* junction and the cathode contact which is formed by the N-Well 45*c*.

Although the invention has been shown and described with respect to certain embodiments, equivalent alterations and modifications will occur to those skilled in the art upon reading and understanding this specification and drawings. In doing so, those skilled in the art should realize that such alterations and modifications are within the spirit and scope of the present invention as set forth in the appended claims and equivalents thereon. Those skilled in the art also will understand that the semiconductor structure described by the present inventive technique will be part of a larger semiconductor device incorporating a plurality of semiconductor devices. For example, the semiconductor structure could be part of a p-channel or n-channel MOSFET integrated circuit, or part of a CMOS which incorporates both p-channel and n-channel MOSFET integrated circuits.

What is claimed is:

1. In a structure of an integrated circuit chip, the structure comprising:
   a substrate with a region of triple wells, N-Wells separated by and isolated from a P-Well therein;
   a MOSFET with a source, drain and gate in the isolated P-Well;
   a lateral p-n-p having a base, emitter and collector in each of the N-Wells and integrated with the MOSFET;
   an input/output pad coupled to the emitters of the lateral p-n-p and to the drain of the MOSFET; and
   VDD applied to each of the bases of the lateral p-n-p, the source and the gate of the MOSFET and the collectors of the lateral p-n-p and source of the MOSFET being connected to ground, whereby a parasitic lateral n-p-n turns on and safely discharges ESD current to ground when an ESD event occurs by creating an avalanche generation of carriers near the drain of the P-Well junction and an increase in the lateral p-n-p collector current.

2. The structure of claim 1, wherein a diode is deposed in the path of the emitter to the pad.

3. The structure of claim 2, wherein, during normal operation, the diode is reversed biased.

4. The structure of claim 2, wherein more than one diode is deposed in the path of the emitter to the pad.

5. The structure of claim 1, wherein a diode is deposed in the path of the base of lateral p-n-p to VDD.

6. The structure of claim 5, wherein a diode also is deposed in the path of the emitter to the pad.

7. The structure of claim 1, wherein the substrate includes a N band beneath the P-Well and the N-Well.

8. The structure of claim 1, wherein, during an ESD event, the emitters of the lateral p-n-p injects holes into the isolated P-Well, lowering the ESD trigger voltage and increasing the failure current of the MOSFET.

9. The structure of claim 1, wherein the collector of the lateral p-n-p is connected to the gate of the MOSFET.

10. The structure of claim 9, wherein the connection is deposed in the isolated P-Well.

11. The structure of claim 1, wherein the structure provides ESD protection of the integrated circuit chip.

12. The structure of claim 1, wherein, during an ESD event, the emitters of the lateral p-n-p injects holes into the isolated P-Well.

13. The structure of claim 12, wherein a P-well current turns on the parasitic lateral n-p-n.

* * * * *